(12) United States Patent
Cui et al.

(10) Patent No.: US 12,155,396 B2
(45) Date of Patent: Nov. 26, 2024

(54) INTELLIGENT ELECTRONIC DEVICE

(71) Applicant: Accuenergy (Canada) Inc., Toronto (CA)

(72) Inventors: Shaohang Cui, Toronto (CA); Ketao Li, Toronto (CA); Yufan Wang, Toronto (CA); Liang Wang, Toronto (CA)

(73) Assignee: Accuenergy (Canada), Inc, Toronto (CA)

( * ) Notice: Subject to any disclaimer, the term of this patent is extended or adjusted under 35 U.S.C. 154(b) by 165 days.

(21) Appl. No.: 18/075,388

(22) Filed: Dec. 5, 2022

(65) Prior Publication Data
US 2024/0187010 A1 Jun. 6, 2024

(51) Int. Cl.
| | |
|---|---|
| *H03M 1/00* | (2006.01) |
| *H03M 1/12* | (2006.01) |
| *H03M 1/16* | (2006.01) |
| *G01R 21/133* | (2006.01) |
| *G01R 31/317* | (2006.01) |

(52) U.S. Cl.
CPC ......... *H03M 1/002* (2013.01); *H03M 1/1245* (2013.01); *H03M 1/164* (2013.01); *G01R 21/133* (2013.01); *G01R 31/317* (2013.01)

(58) Field of Classification Search
CPC .... H03M 1/002; H03M 1/1245; H03M 1/164; G01R 31/317; G01R 21/133
See application file for complete search history.

(56) References Cited

U.S. PATENT DOCUMENTS

2019/0346506 A1* 11/2019 Schamber ............. G06Q 50/06

\* cited by examiner

*Primary Examiner* — Joseph J Lauture
(74) *Attorney, Agent, or Firm* — Michael D. Eisenberg

(57) ABSTRACT

An Intelligent Electronic Device (IED) for measuring a zero-crossing based electrical parameter when there is power quality disturbance in the power supply network. More specifically, the IED includes at least one sensor configured for sensing at least one electrical parameter of electrical power distributed from an electrical distribution system to a load, at least one analog-to-digital converter coupled to the at least one sensor and configured for converting an analog signal output from the at least one sensor to digital data, at least one processing module coupled to the at least one analog-to-digital converter, the at least one processing module is configured to receive the digital data, determine that the IED enters loss of synchronization according to the received digital data, measure a zero-crossing based electrical parameter of the digital data according to the cycle of the digital signal immediately before loss of synchronization.

9 Claims, 5 Drawing Sheets

INTELLIGENT ELECTRONIC DEVICE

FIELD OF THE INVENTION

The present disclosure generally relates to the field of Intelligent Electronic Devices for electrical utility services and, more specifically, to digital electrical power and energy meters for use in performing electrical utility services.

BACKGROUND

Power quality disturbances in the power supply network may affect measurement accuracy of some electrical parameters dependent on the zero crossing. An interruption is one of them. The interruption is a power quality problem with the most perceivable effect on facilities. It generally affects the industrial sector, particularly the continuous process industry. In addition, the communication and information processing business are also significantly disturbed. The interruption is defined as the decrease in the voltage supply level to less than 10% of nominal for up to one (1) minute duration. They are further subdivided into: Instantaneous (½ to 30 cycles), Momentary (30 cycles to 3 seconds) and Temporary (3 seconds to 1 minute).

The interruption mostly results from reclosing circuit breakers or reclosers attempting to clear non-permanent faults, first opening, and then reclosing after a short time delay. The devices are usually on the distribution system, but at some locations, momentary interruptions also occur for faults on the subtransmission system. The extent of interruption will depend on the reclosing capability of the protective device. For example, instantaneous reclosing will limit the interruption caused by a temporary fault to less than 30 cycles. On the other hand, time delayed reclosing of the protective device may cause a momentary or temporary interruption.

Since the voltage level is less than 10% nominal during the interruption, it may be difficult to determine the zero crossing accurately. Some electrical parameters whose measurements are dependent on the zero crossings such as Root Mean Square (RMS) voltage measured by Intelligent Electronic Devices, may be inaccurate during interruptions.

Therefore, further improvements to Intelligent Electronic Devices would be desirable.

SUMMARY OF THE INVENTION

The embodiments of the present disclosure generally relate to digital electrical power and energy meters for use in performing electrical utility services.

In some embodiments, the present disclosure provides an intelligent electronic device (IED). The IED includes at least one sensor configured for sensing at least one electrical parameter of electrical power distributed from an electrical distribution system to a load; at least one analog-to-digital converter coupled to the at least one sensor and configured for converting an analog signal output from the at least one sensor to digital data; at least one processing module coupled to the at least one analog-to-digital converter is configured to receive the digital data; determine that the IED enters loss of synchronization according to the received digital data; measure a zero-crossing based electrical parameter of the digital data according to the cycle of the digital signal immediately before loss of synchronization.

These and other features and aspects of the present disclosure will become fully apparent from the following detailed description of exemplary embodiments, the appended claims and the accompanying drawings.

DETAILED DESCRIPTION

Embodiments of the present disclosure will be described herein with reference to the accompanying drawings. In the following descriptions, well-known functions or constructions are not described in detail to avoid obscuring the present disclosure. The word "exemplary" is used herein to mean "serving as an example." Any configuration or design described herein as "exemplary" is not to be construed as preferred, or advantageous, over other configurations or designs. Herein the phrase "coupled" is defined as "directly connected to or indirectly connected with" one or more intermediate components. Such intermediate components may include both hardware and software-based components.

It is further noted that, unless otherwise indicated, all functions described herein may be implemented in either software, hardware, or some combination thereof.

It should be recognized that the present disclosure can be performed in numerous ways, including as a process, an apparatus, a system, a method, or a computer-readable medium such as a computer storage medium.

As used herein, Intelligent Electronic Devices ("IEDs") can be any device that senses electrical parameters and computes data including, but not limited to, Programmable Logic Controllers ("PLCs"), Remote Terminal Units ("RTUs"), electrical power meters, protective relays, fault recorders, phase measurement units, and other devices which are coupled with power distribution networks to control and manage the distribution or consumption of electrical power.

Figure 1:
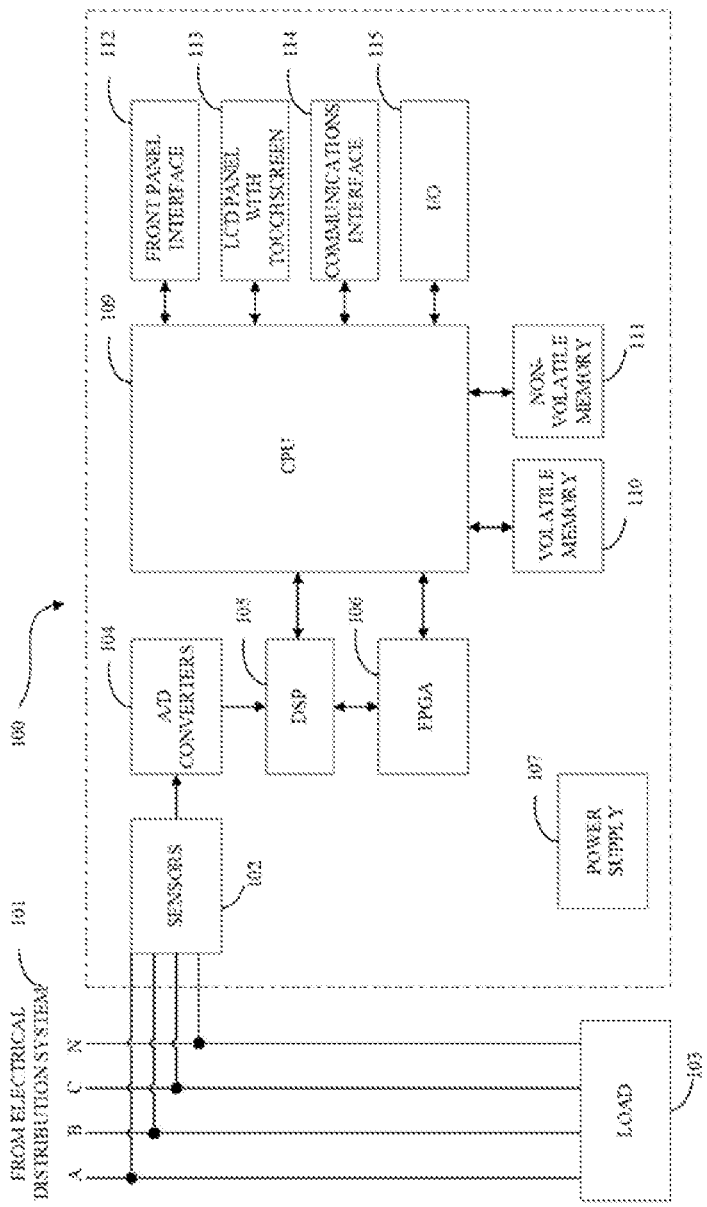
FIG. 1 is a block diagram of an exemplary Intelligent Electronic Device.

FIG. 1 is a block diagram of an Intelligent Electronic Device (IED) 100 for monitoring power usage and power quality for any metered point within a power distribution system 101.

The IED 100 illustrated in FIG. 1 includes multiple sensors 102 coupled with various phases A, B, C, and N (neutral) of an electrical distribution system 101, multiple analog-to-digital (A/D) converters 104, a power supply 107, volatile memory 110, non-volatile memory 111, a front panel interface 112, and a processing module that includes at least one Central Processing Unit (CPU) and/or one or more Digital Signal Processors (DSP), two of which are shown DSP 105 and CPU 109. The IED 100 also includes a Field Programmable Gate Array (FPGA) 106 which performs several functions including acting as a communications bridge for transferring data between the various processors (105 and 109).

The sensors 102 sense electrical parameters, such as voltage and current, on incoming lines (phase A, phase B, phase C, and neutral N) of an electrical power distribution system 101 coupled to at least one load 103 that consumes the provided power. In one embodiment, the sensors 102 include current transformers and potential transformers, where one current transformer and one voltage transformer will be coupled to each phase of the incoming power lines. The primary winding of each transformer will be coupled to the incoming power lines, and the secondary winding of each transformer will output a voltage representative of the sensed voltage and current. The output of each transformer will be coupled with the A/D converters 104, which are configured to convert the analog voltage output from the transformer to a digital signal that can be processed by the DSP 105.

A/D converters 104 are configured to convert an analog voltage output to a digital signal that is transmitted to a gate array, such as Field Programmable Gate Array (FPGA) 106. The digital signal is transmitted from the FPGA 106 to the CPU 109.

The CPU 109 or DSP Processors 105 are configured to receive digital signals from the A/D converters 104 and perform the necessary calculations to determine power usage and control the overall operations of the IED 100. In some embodiments, the CPU 109 and DSP 105 may be combined into a single processor to serve the functions of each component. In some embodiments, it is contemplated to use an Erasable Programmable Logic Device (EPLD), a Complex Programmable Logic Device (CPLD), or any other programmable logic device in place of the FPGA 106. In some embodiments, the digital samples, which are output from the A/D converters 104, are sent directly to the CPU 109, effectively bypassing the DSP 105 and the FPGA 106 as a communications gateway.

The power supply 107 provides power to each component of the IED 100. In one embodiment, the power supply 107 is a transformer with its primary windings coupled to the incoming power distribution lines to provide a nominal voltage at its secondary windings. In other embodiments, power may be supplied from an independent power source to the power supply 107.

In FIG. 1, the front panel interface 112 is shown coupled to the CPU 109, which includes indicators, switches, and various inputs.

In FIG. 1, the LCD panel with touchscreen 113 is shown coupled to the CPU 150 for interacting with a user and for communicating events, such as alarms and instructions. The LCD panel with touchscreen 113 may provide information to the user in the form of alpha-numeric lines, computer-generated graphics, videos, animations, etc.

An Input/Output (I/O) interface 115 may be provided for receiving externally generated inputs from the IED 100 and for outputting data, such as serial data, to other devices. In one embodiment, the I/O interface 115 may include a connector for receiving various cards and/or modules that increase and/or change the functionality of the IED 100. In a further embodiment, the I/O interface 115 may include digital output for energy pulse.

The IED 100 also includes volatile memory 110 and non-volatile memory 111. The volatile memory 110 will store the sensed and generated data for further processing and for retrieval when requested to be displayed at the IED 100 or from a remote location. The volatile memory 110 includes internal storage memory, such as Random-Access Memory (RAM). The non-volatile memory 111 includes removable memory, such as magnetic storage memory, optical storage memory (such as various types of CD or DVD media), solid-state storage memory, (such as a CompactFlash card, a Memory Stick, SmartMedia card, MultiMediaCard [MMC], SD [Secure Digital] memory), or any other memory storage that exists currently or will exist in the future. Such memory will be used for storing historical trends, waveform captures, event logs (including timestamps), and stored digital samples for later download to a client application, webserver, or PC application.

In a further embodiment, the IED 100 will include a communication interface 114, also known as a network interface, for enabling communications between the IED, or meter, and a remote terminal unit or programmable logic controller and other computing devices, microprocessors, desktop computers, laptop computers, other meter modules, etc. The communication interface 114 may be a modem, Network Interface Card (NIC), wireless transceiver, or other interface. The communication interface 114 will operate with hardwired and/or wireless connectivity. A hardwired connection may include, but is not limited to, physical cabling (such as parallel cables serial cables, RS232, RS485, USB cables, or Ethernet) and an appropriately configured communication port. The wireless connection may operate under any of the various wireless protocols including, but not limited to, Bluetooth™ interconnectivity, infrared connectivity, radio transmission connectivity (including computer digital signal broadcasting and reception commonly referred to as Wi-Fi or 802.11.X [where x denotes the type of transmission]), satellite transmission, or any other type of communication protocol, communication architecture, or systems currently existing or to be developed for wirelessly transmitting data.

The IED 100 may communicate to a server or other computing device via the communication interface 114. The IED 100 may be connected to a communications network (such as the Internet) by any means. For example, a hardwired or wireless connection, such as dial-up, hardwired, cable, DSL, satellite, cellular, PCS, or wireless transmission (e.g., 802.11a/b/g) may be used. It is noted that the network may be a Local Area Network (LAN), Wide Area Network (WAN), the Internet, or any network that couples multiple computers to enable various modes of communication via network messages. Furthermore, the server will communicate using various protocols, such as Transmission Control Protocol/Internet Protocol (TCP/IP), File Transfer Protocol (FTP), or Hypertext Transfer Protocol (HTTP) or via secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, or via other secure protocol. The server may further include a storage medium for storing the data received from at least one IED or meter and/or storing data to be retrieved by the IED or meter.

In an additional embodiment, when a power event occurs, such as a voltage surge, voltage sag, or current short circuit, the IED 100 may also have the capability of not only digitizing waveforms but storing the waveform and transferring that data upstream to a central computer, such as a remote server. The power event may be captured, stored to memory (e.g., non-volatile RAM), and additionally transferred to a host computer within the existing communication infrastructure either immediately, in response to a request from a remote device or computer, or later in response to a polled request. The digitized waveform will also allow the CPU 109 to compute other electrical parameters such as harmonics, magnitudes, symmetrical components, and phasor analysis.

In a further embodiment, the IED 100 will execute an e-mail client and will send notification e-mails to the utility or directly to the customer when a power quality event occurs. This allows utility companies to dispatch crews to repair the condition. The data generated by the meters is used to diagnose the cause of the condition. The data is transferred through the infrastructure created by the electrical power distribution system. The e-mail client will utilize POP3 or another standard e-mail protocol.

The techniques of the present disclosure can be used to automatically maintain program data and provide field-wide updates upon which IED firmware and/or software can be upgraded. An event command can be issued by a user, on a schedule, or through a digital communication that will trigger the IED 100 to access a remote server and obtain the new program code. This will ensure that program data will be maintained, assuring the user that all information is displayed identically on all units.

It is to be understood that the present disclosure may be implemented in various forms of hardware, software, firmware, special purpose processors, or a combination thereof. The IED 100 also includes an operating system and application programs. The various processes and functions described herein may either be part of an application program (or a combination thereof) which is executed via the operating system.

Because some of the system components and methods depicted in the accompanying figures may be implemented using either software or firmware, it is to be further understood that the actual connections between the system components (or the process steps) may differ depending on the specific way the present disclosure is programmed. Given the teachings of the present disclosure provided herein, one of ordinary skill in the related art will be able to contemplate these and similar implementations or configurations of the present disclosure.

Figure 2:
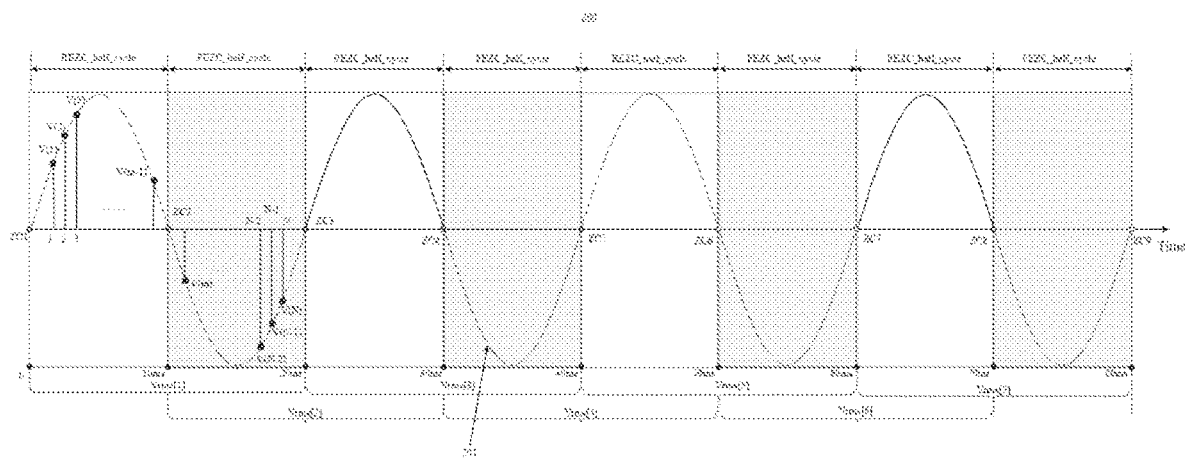
FIG. 2 is a diagram which depicts an exemplary calculation of RMS voltage refreshed each half-cycle in prior art.

FIG. 2 will now be discussed, which depicts an exemplary calculation of RMS voltage refreshed each half-cycle in prior art. RMS voltage refreshed each half-cycle is a value of RMS voltage measured over 1 cycle, commencing at a fundamental zero crossing, and refreshed each half-cycle.

In FIG. 2, x-axis represents time and y-axis represents voltage of an electrical signal 201. The electrical signal 201 may be a sensed electrical signal by sensors 102 from one of phases A, B, and C of the electrical distribution system 101. The electrical signal 201 can be converted to a digital signals output to DSP 105 or CPU 109.

There are 9 zero crossings ranging from ZC1 to ZC9. In one embodiment, sign changes and zero points are identified in V samples by checking if the products of $V_{(m)} \times V_{(m-1)}$ are less than or equal to zero where $V_{(m)}$ refers to the current sample and $V_{(m-1)}$ refers to the prior sample. Thus, if the products of $V_{(m)} \times V_{(m-1)}$ are less than or equal to zero, a zero crossing exists between the current and prior sample. When a zero crossing exists between the current and prior sample, if the prior sample $V_{(m-1)} < 0$, the zero crossing is named a Rising Edge Zero Crossing (REZC). Similarly, if the prior sample $V_{(m-1)} > 0$, the zero crossing is named a Falling Edge Zero Crossing (FEZC). ZC1, ZC3, ZC5, ZC7, ZC9 are REZCs. ZC2, ZC4, ZC6, ZC8 are FEZCs.

In FIG. 2, the electrical signal 201's frequency is 50 Hz, and the period of one full cycle is 20 ms. There are shaded areas and unshaded areas in FIG. 2. A shaded area represents a REZC half cycle and an unshaded area represents a FEZC half cycle. Shaded and non-shaded areas alternate in turn for duration of 10 ms. In a good power quality condition, both REZC_half_cycle and FEZC half cycle are 10 ms.

At the time of 20 ms, RMS voltage refreshed each half-cycle of the electrical signal 201 for a cycle of ZC1~ZC3 $V_{rms}[1]$ can be calculated as follows:

$$V_{rms}[1] = \sqrt{\frac{1}{N} \sum_{i=1}^{N} V_{(i)}^2}$$

Where N represents the number of samples between ZC1 to ZC3, $V_{(i)}$ represents ith sample voltage.

Similarly, RMS voltages refreshed each half-cycle of the electrical signal 201 $V_{rms}[2]$, $V_{rms}[3]$, $V_{rms}[4]$, $V_{rms}[5]$, $V_{rms}[6]$, $V_{rms}[7]$ can be calculated accordingly. $V_{rms}[1]$, $V_{rms}[3]$, $V_{rms}[5]$, $V_{rms}[7]$ may also be RMS voltages refreshed each cycle of the electrical signal 201. RMS voltages refreshed each cycle of the electrical signal 201 reflect the voltage change sooner than RMS voltages refreshed each cycle of the electrical signal 201.

The calculation of RMS voltage may be executed in DSP 105 or CPU 109. RMS voltages refreshed each cycle or RMS voltages refreshed each half-cycle can be used to monitor the power quality of electrical signal 201 or measure the amount of electric energy consumed by a resident, a business, or an electrically powered device.

In FIG. 2, RMS voltage refreshed each half-cycle is one of zero crossing based electrical parameters because its calculation is based on the accurate zero crossings such as ZC2, ZC4. In other words, RMS voltage refreshed each half-cycle is computed at the sample data between two consecutive REZCs or FEZCs. Similarly, RMS current refreshed each half-cycle is also one of zero crossing based electrical parameters.

Figure 3:
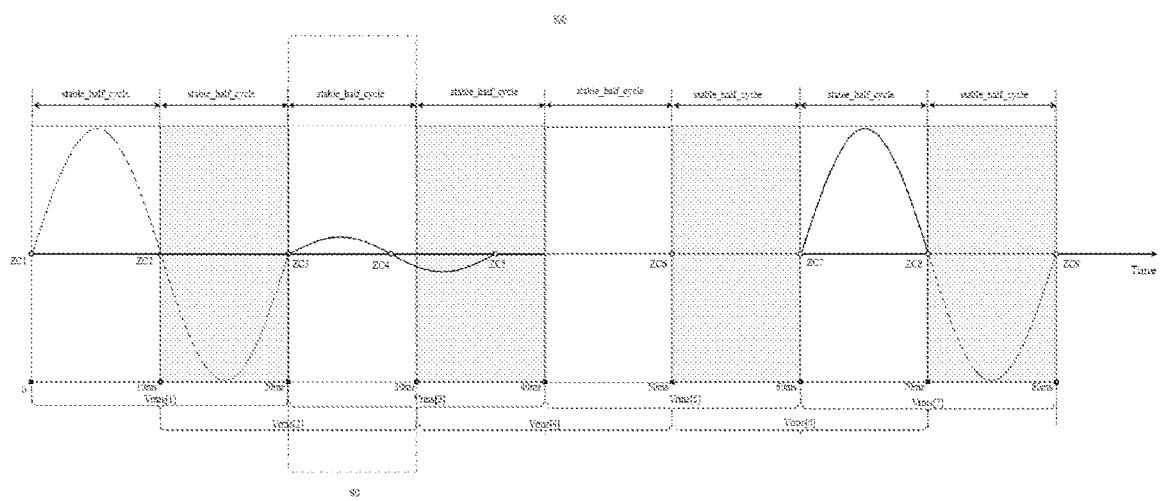
FIG. 3 is a diagram which illustrates how to determine that IED enters loss of synchronization

When an interruption occurs, the voltage of electrical signal 201 may decrease to less than 10% of nominal voltage. It's very difficult to determine the accurate zero crossing during the interruption. The state when the zero crossing cannot be determined accurately due to the power quality disturbances (e.g., interruption) may be named loss of synchronization. Refer to FIG. 3, which illustrates an exemplary loss of synchronization. At time of 20 ms, an interruption occurs. ZC3 may be identified as a zero crossing by calculating the product of the current and prior sample. However, ZC3 cannot be used to calculate RMS voltage refreshed each half-cycle $V_{rms}[2]$ because of the bad power quality. Under the bad power quality, zero crossing ZC5 can even drift. It's not reliable to calculate RMS voltage refreshed each half-cycle based on zero crossings such as ZC3, ZC5 during loss of synchronization.

The disclosure presents a method to determine that the IED 100 enters loss of synchronization. In some embodiments, a status monitor may be started to monitor whether the IED 100 enters loss of synchronization. The status monitor may be a thread running in the CPU 109 or DSP 105. The status monitor may also be a piece of logic function implemented in the FPGA 106. If the IED 100 enters the loss of synchronization, an appropriate RMS voltage refreshed each half-cycle calculation method will be proposed.

Figure 4:
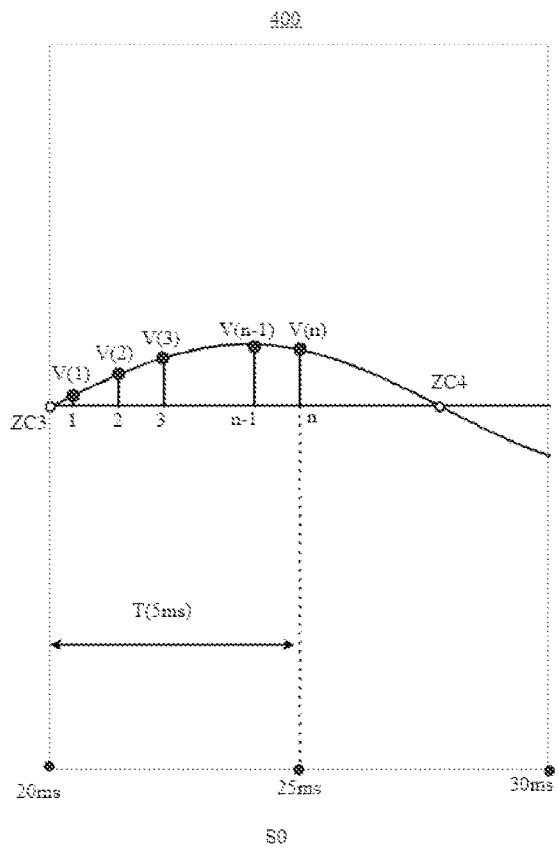
FIG. 4 is a partial enlarged view of S0 portion of FIG. 3.

Refer to FIG. 3 and FIG. 4, which illustrate how to determine that IED 100 enters loss of synchronization. FIG.

4 is also a partial enlarged view of S0 portion of FIG. 3. In FIG. 4, there are n samples (from V(1) to V(n)) from the electrical signal 201.

At the time of 20 ms, the status monitor finds that a zero crossing ZC3 is detected. Then, the status monitor starts to count a total number of samples (from V(1) to V(n)) lower than a predefined limit (e.g., 5V) immediately after the zero crossing ZC3 for a predefined period. In some embodiments, the predefined period may be one-fourth of previous full cycle immediately before the zero crossing ZC3. The previous full cycle is the period between ZC1 and ZC3 with a duration of 20 ms. The one-fourth of previous full cycle before the zero crossing ZC3 is T(5 ms). If the total number is above the predefined count threshold, the IED 100 is determined to enter the loss of synchronization.

Figure 5:
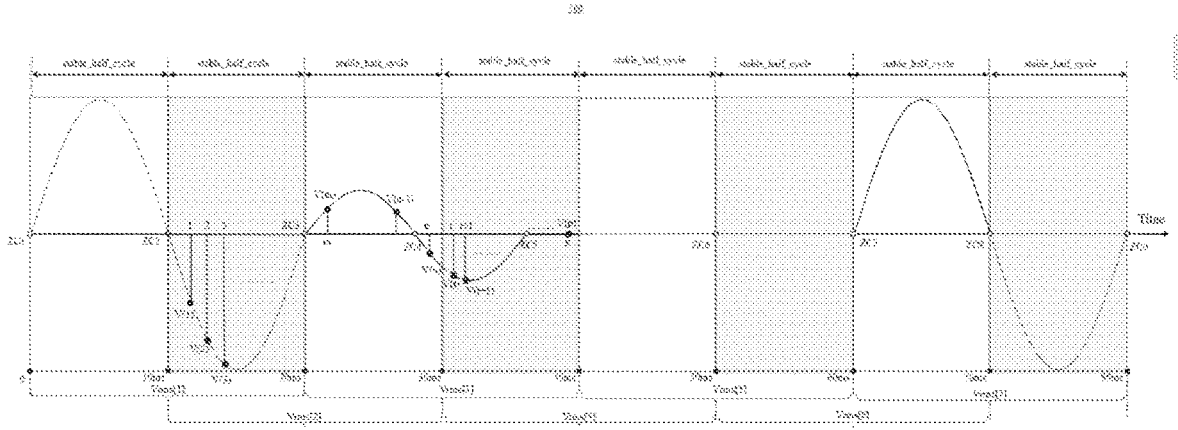
FIG. 5 is a diagram which illustrates how the RMS voltage refreshed each half-cycle of electrical signal is calculated when IED enters the loss of synchronization corresponding to FIG. 3.

FIG. 5 illustrates how the RMS voltage refreshed each half-cycle of electrical signal 201 is calculated when IED 100 enters the loss of synchronization corresponding to FIG. 3.

In FIG. 5, stable_half_cycle(10 ms) is one half of time between ZC1 and ZC3. The cycle ZC1~ZC3 is a stable cycle before IED 100 enters the loss of synchronization. There are shaded areas and unshaded areas in FIG. 5. Shaded and non-shaded areas alternate in turn for duration of 10 ms. After the IED 100 enters the loss of synchronization, RMS voltage refreshed each half-cycle is calculated based on samples between shaded and non-shaded areas.

At the time of 30 ms, RMS voltage refreshed each half-cycle of the electrical signal 201 for a period of 10 ms~30 ms $V_{rms}[2]$ can be calculated.

$$V_{rms}[2] = \sqrt{\frac{1}{N}\sum_{i=1}^{n} V_{(i)}^2}$$

Where N represents the number of samples between 10 ms to 30 ms, $V_{(i)}$ represents ith voltage, n is the last sample between 10 ms to 30 ms.

At the time of 40 ms, RMS voltage refreshed each half-cycle of the electrical signal 201 for a period of 20 ms~40 ms $V_{rms}[2]$ can be calculated.

$$V_{rms}[3] = \sqrt{\frac{1}{N}\sum_{i=m}^{p} V_{(i)}^2}$$

Where N represents the number of samples between 20 ms to 40 ms, $V_{(i)}$ represents ith voltage, m is the first sample and p is the last sample between 20 ms to 40 ms.

Similarly, RMS voltages refreshed each half-cycle of the electrical signal 201 $V_{rms}[4]$, $V_{rms}[5]$, $V_{rms}[6]$, $V_{rms}[7]$ can be calculated. $V_{rms}[1]$, $V_{rms}[3]$, $V_{rms}[5]$, $V_{rms}[7]$ may also be RMS voltages refreshed each cycle of the electrical signal 201.

Figure 6:
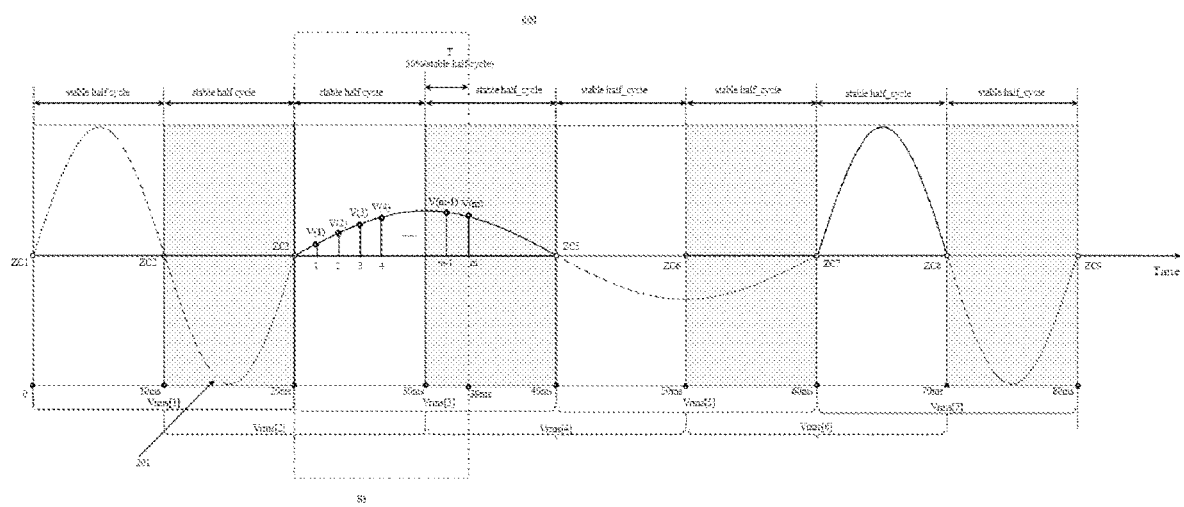
FIG. 6 is a diagram which illustrates how to determine that IED enters loss of synchronization according to some embodiments.

The disclosure presents another method to determine that the IED 100 enters loss of synchronization. In some embodiments, the status monitor calculates a gap between two consecutive zero crossings. If the gap is greater than the predefined value, the IED 100 is determined to enter the loss of synchronization. Refer to FIG. 6, which illustrates how to determine that IED 100 enters loss of synchronization according to some embodiments.

In FIG. 6, the stable half cycle is 20 ms, which is the half cycle of electrical signal 201 with a line frequency of 50 Hz. The stable half cycle is measured when the electrical signal 201 is in good power quality. There is an interruption after ZC3 (30 ms), the status monitor starts to calculate the gap between ZC3 and ZC5. In FIG. 6, the gap threshold is set to (1+30%) stable half cycle=33 ms. It can be observed that there is no zero crossing from ZC3 to the gap threshold of 33 ms, so IED 100 is determined to enter the loss of synchronization. There is a zero crossing ZC5 at 40 ms, which falls behind the gap threshold 33 ms.

Figure 7:
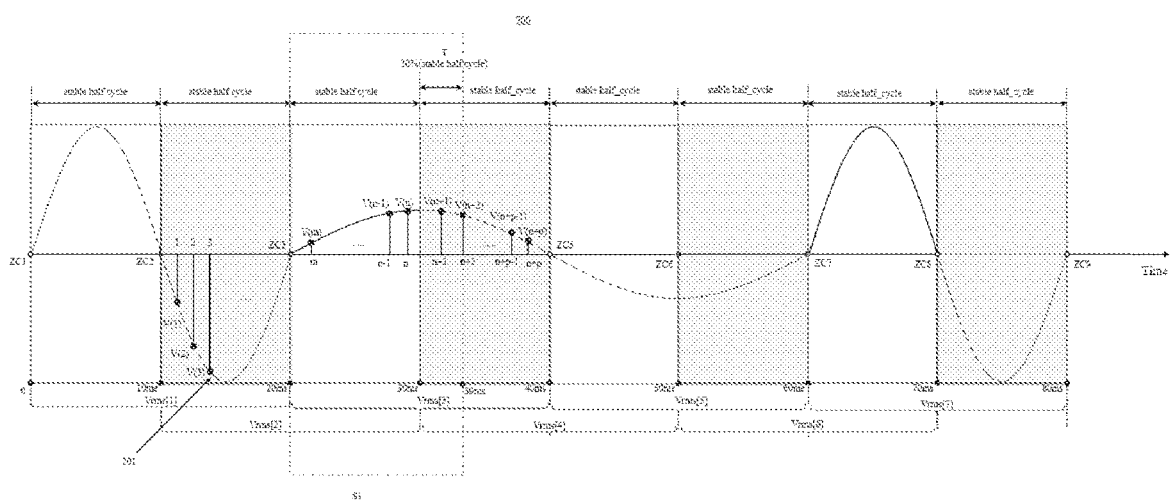
FIG. 7 is a diagram which illustrates how RMS voltage refreshed each half-cycle of electrical signal is calculated when IED enters the loss of synchronization corresponding to FIG. 6.

FIG. 7 illustrates how RMS voltage refreshed each half-cycle of electrical signal 201 is calculated when IED 100 enters the loss of synchronization corresponding to FIG. 6.

At the time of 30 ms, RMS voltage refreshed each half-cycle of the electrical signal 201 for a period of 10 ms~30 ms $V_{rms}[2]$ can be calculated as below:

$$V_{rms}[2] = \sqrt{\frac{1}{N}\sum_{i=1}^{n} V_{(i)}^2}$$

where N represents the number of samples between 10 ms to 30 ms, $V_{(i)}$ represents ith voltage, n is the last sample between 10 ms to 30 ms.

At the time of 40 ms, RMS voltage refreshed each half-cycle of the electrical signal 201 for a period of 20 ms~40 ms $V_{rms}[2]$ can be calculated as below:

$$V_{rms}[3] = \sqrt{\frac{1}{N}\sum_{i=m}^{n+p} V_{(i)}^2}$$

where N represents the number of samples between 20 ms to 40 ms, $V_{(i)}$ represents ith voltage, m is the first sample between 20 ms to 40 ms, n+p is the last sample between 20 ms to 40 ms.

Similarly, RMS voltages refreshed each half-cycle of the electrical signal 201 $V_{rms}[4]$, $V_{rms}[5]$, $V_{rms}[6]$, $V_{rms}[7]$ can be calculated. $V_{rms}[1]$, $V_{rms}[3]$, $V_{rms}[5]$, $V_{rms}[7]$ may also be RMS voltages refreshed each cycle of the electrical signal 201.

When the IED 100 enters the loss of synchronization, the monitor program continues to monitor the electrical signal 201. When some conditions are met, the IED 100 will exit the loss of synchronization.

In some embodiments, the monitor program will start to calculate a 10/12 cycle RMS voltage value of the electrical signal 201 once IED 100 enters the loss of synchronization. The 10/12 cycle RMS voltage value is RMS voltage value for a period of 200 ms of the electrical signal 201. For line frequency 50 Hz power system, the period of 200 ms includes 10 cycles. For line frequency 60 Hz power system, the period of 200 ms includes 12 cycles.

Figure 8:
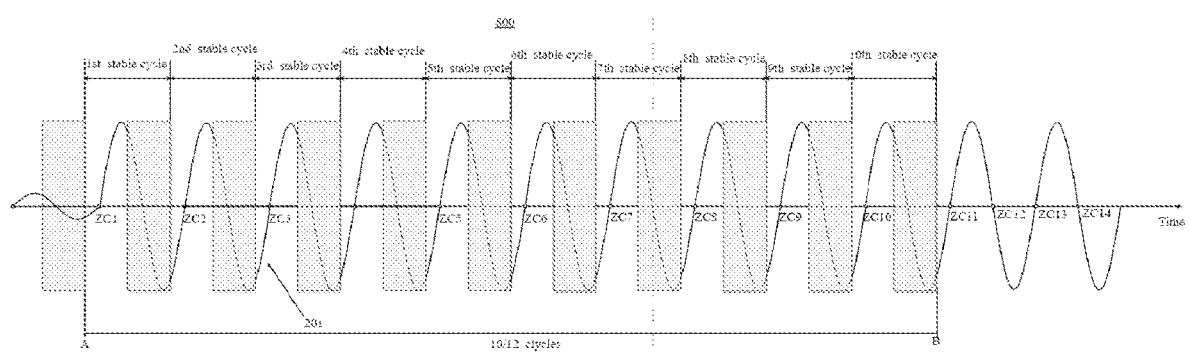
FIG. 8 is a diagram which illustrates the condition under which IED exits the loss of synchronization.

FIG. 8 illustrates the condition under which IED 100 exits the loss of synchronization. In FIG. 8, a stable cycle is the cycle immediately before IED enters the loss of synchronization. For example, in FIG. 3, the stable cycle is 20 ms from ZC1 to ZC3 before IED 100 enters the loss of synchronization at ZC3. When IED 100 enters the loss of synchronization, the cycle will become unstable because the zero crossings cannot be determined accurately. It's ideal to use the cycle immediately before IED enters the loss of synchronization. The electrical signal 201 is from a power system with line frequency 50 Hz. In some embodiments, the monitor program calculates the 10/12 cycle RMS voltage value of the electrical signal 201 for 10 cycles AB. If the 10/12 cycle RMS voltage value of the electrical signal 201 is greater than a specified threshold, the IED 100 may exit from the loss of synchronization. Once IED 100 exits from the loss of synchronization at the time B, RMS voltage values will be calculated based on zero crossings ZC11~ZC14 same as illustrated in FIG. 2.

In some embodiment, if the 10/12 cycle RMS voltage value of the electrical signal 201 is greater than a specified value, the monitor program will further calculate the total number of the rising edge zero crossing during the 10/12 cycles to determine whether IED 100 exits the loss of synchronization. If the total number of the rising edge zero crossing is greater than 9 and is less than 15 for the electrical signal 201 with 60 Hz line frequency, then the IED 100 may exit the loss of synchronization. Or, if the total number of the rising edge zero crossing is greater than 7 and is less than 13 for the electrical signal 201 with 50 Hz line frequency, then the IED 100 may exit the loss of synchronization. Once IED 100 exits from the loss of synchronization at the time B, RMS voltage values will be calculated based on zero crossings ZC11~ZC14 same as illustrated in FIG. 2.

Embodiments of the teachings of the present disclosure have been described in an illustrative manner. It is to be understood that the terminology that has been used, is intended to be in the nature of words of description rather than of limitation. Many modifications and variations of the embodiments are possible in light of the above teachings. Therefore, within the scope of the appended claims, the embodiments can be practiced other than specifically described.

What is claimed is:

1. An intelligent electronic device (IED) comprising:
   at least one sensor configured for sensing at least one electrical parameter of electrical power distributed from an electrical distribution system to a load;
   at least one analog-to-digital converter coupled to the at least one sensor and configured for converting an analog signal output from the at least one sensor to digital data;
   at least one processing module coupled to the at least one analog-to-digital converter, the at least one processing module is configured to:
   receive the digital data;
   determine that the IED enters loss of synchronization according to the received digital data;
   measure a zero-crossing based electrical parameter of the digital data according to the cycle of the digital signal immediately before loss of synchronization.

2. The IED of claim 1, wherein determine that the IED enters loss of synchronization according to the received digital data comprising:
   counts a total number of samples lower than a predefined limit in a predefined period immediately after a zero-crossing;
   determine that the IED enters loss of synchronization if the total number is above the predefined threshold.

3. The IED of claim 2, wherein the predefined period is one-fourth of previous cycle immediately before the zero-crossing.

4. The IED of claim 1, wherein determine that the IED enters loss of synchronization according to the received digital data includes:
   obtain a period between the zero crossing and an expected zero-crossing;
   determine that the IED enters loss of synchronization if there is no detected zero crossing during the period.

5. The IED of claim 1, wherein a zero-crossing based electrical parameter is one of:
   RMS voltage refreshed each half-cycle;
   RMS current refreshed each half-cycle;
   RMS voltage refreshed each cycle;
   RMS current refreshed each cycle.

6. The IED of claim 1, wherein the at least one processing module is further configured to:
   determine that the IED exits loss of synchronization according to the received digital data;
   measure a zero-crossing based electrical parameter of the digital data according to the corresponding zero-crossings.

7. The IED of claim 6, wherein determine that the IED exits loss of synchronization according to the received digital data comprising:
   calculate a 10/12 cycle RMS value when the IED enters loss of synchronization according to the cycle of the digital signal immediately before loss of synchronization;
   determine that the IED exits loss of synchronization if the 10/12 cycle RMS value is greater than a specified value.

8. The IED of claim 6, wherein determine that the IED exits loss of synchronization according to the received digital data comprising:
   calculate a 10/12 cycle RMS value when the IED enters loss of synchronization according to the cycle of the digital signal immediately before loss of synchronization;
   count a total number of the rising edge zero crossing during the 10/12 cycles;
   determine that the IED exits loss of synchronization if the 10/12 cycle RMS value is greater than a specified value and the total number of the rising edge zero crossing is within the specified range.

9. The IED of claim 8, wherein the total number of the rising edge zero crossing is within the specified range comprising:
   the total number of the rising edge zero crossing is greater than 7 and is less than 13 for the electrical power with a 50 Hz line frequency, or
   the total number of the rising edge zero crossing is greater than 9 and is less than 15 for the electrical power with a 60 Hz line frequency.

* * * * *